United States Patent
Mehta et al.

(10) Patent No.: US 12,356,758 B2
(45) Date of Patent: Jul. 8, 2025

(54) SUPERLUMINESCENT DIODE WITH INTEGRATED ABSORBER AND PHOTODETECTOR

(71) Applicant: Intel Corporation, Santa Clara, CA (US)

(72) Inventors: Karan Mehta, San Francisco, CA (US); Richard Jones, San Mateo, CA (US); Olufemi Dosunmu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 800 days.

(21) Appl. No.: 17/462,136

(22) Filed: Aug. 31, 2021

(65) Prior Publication Data

US 2021/0391495 A1    Dec. 16, 2021

(51) Int. Cl.
| | |
|---|---|
| *H10H 20/00* | (2025.01) |
| *G01R 31/26* | (2020.01) |
| *H10H 20/857* | (2025.01) |
| *G01C 19/72* | (2006.01) |

(52) U.S. Cl.
CPC ....... *H10H 20/042* (2025.01); *G01R 31/2635* (2013.01); *H10H 20/857* (2025.01); *G01C 19/721* (2013.01)

(58) Field of Classification Search
None
See application file for complete search history.

(56) References Cited

U.S. PATENT DOCUMENTS

| | | | | |
|---|---|---|---|---|
| 11,025,871 B1* | 6/2021 | Magoz | ............. | G02B 26/101 |
| 2021/0328422 A1* | 10/2021 | Barker | ............. | H02J 3/36 |
| 2021/0384181 A1* | 12/2021 | Xu | ............. | H01L 24/32 |
| 2022/0026460 A1* | 1/2022 | Kobayashi | ............. | G01F 1/69 |
| 2022/0158052 A1* | 5/2022 | Lee | ............. | H10H 20/01 |
| 2023/0238369 A1* | 7/2023 | Kusunoki | ............. | G09F 9/30 |
| | | | | 257/79 |
| 2024/0055566 A1* | 2/2024 | Tae | ............. | H01L 25/167 |

(Continued)

OTHER PUBLICATIONS

Kejun Shang et al., "Near-Navigation-Grade Interferometric Fiber Optic Gyroscope With An Integrated Optical Chip," OSA Publishing, Chinese Optics Letters, vol. 18, Issue 12, 2020, 3 Pgs.

(Continued)

*Primary Examiner* — Wilson Lee
(74) *Attorney, Agent, or Firm* — Essential Patents Group, LLP

(57) ABSTRACT

In one embodiment of a superluminescent diode, a first diode adapted on a semiconductor die is to be forward-biased to output optical energy in response to a bias signal, and a second diode adapted on the semiconductor die is to be reverse-biased, the second diode to receive and absorb back propagating optical energy from the first diode and output a measure of the back propagating optical energy as an absorber feedback current. A comparator may be configured to compare the absorber feedback current to a reference current and output a comparison signal, and a driver control circuit coupled to the comparator may provide the bias signal based at least in part on the comparison signal. Other embodiments are described and claimed.

9 Claims, 4 Drawing Sheets

(56) References Cited

U.S. PATENT DOCUMENTS

2024/0186454 A1\* 6/2024 Liu .................... H10H 20/819

OTHER PUBLICATIONS

Norman S.K. Kwong et al., "High Power, High Efficiencyt Window Buried Heterostructure GaAlAs Superluminescent Diode With An Integrated Absorber," Appl. Phys. Lett. 51 (23), Dec. 7, 1987, pp. 1879-1881.
N.S.K. Kwong et al., "High-Power High-Efficiency GaAlAs Superluminescent Diodes With An Internal Absorber For Lasing Suppression," IEEE Journal of Quantum Electronics, vol. 25, No. 4, Apr. 1989, pp. 696-704.
D Molter et al., "SLD-Driven Terahertz Cross-Correlation Spectroscopy," 44th IEEE Conference Publication, IEEE Xplore, 2019, 2 pgs.

\* cited by examiner

SUPERLUMINESCENT DIODE WITH INTEGRATED ABSORBER AND PHOTODETECTOR

BACKGROUND

Superluminescent diodes (SLEDs) are used for applications where it is advantageous to use an incoherent or broadband light source instead of a laser (coherent light source). Example applications include multimode communication systems, spectroscopy, and fiber optic gyroscopes. When light sources such as laser diodes and SLEDs are integrated on a photonics integrated circuit (PIC), a monitor photodiode is typically coupled to the front side of the SLED in the PIC to measure the optical output power emitted by the SLED. However, this configuration requires a splitter on the front side to couple some of the optical energy to the photodetector, which can cause optical loss and inaccuracies in measurement, as well as increasing component counts, area costs, and power consumption.

DETAILED DESCRIPTION

In various embodiments, a superluminescent light emitting diode (SLED) may be realized by integrating a forward-biased gain section on a common semiconductor die with a backside absorber which also functions as an integrated photodetector, which may be implemented as a reverse-biased diode. By integrating on a single die both SLED and integrated photodetector, a smaller circuit may be realized. Still further, greater power sensitivity may be realized with an integrated backside photodetector compared to a configuration with a front-side photodetector, in that the backward propagating light that is detected by the integrated photodetector has greater intensity for a given output power due to lack of attenuation by optical splitters.

By integrating a monitor photodetector (MPD) into a SLED, the device's physical footprint may be reduced and the device's output coupling efficiency may be increased by eliminating the need for a splitter. An integrated SLED in accordance with an embodiment has a rear absorber that doubles up in functionality as both (1) an absorber of backward propagating light and (2) an MPD that detects the photocurrent generated by the absorbed light. The rear absorber is a reverse-biased semiconductor diode made of the same material as the SLED's gain section. The absorber ensures that there is insufficient optical feedback for the superluminescent diode to become a laser. The absorber diode is reverse-biased to extract photogenerated carriers (photocurrent) from the device under high optical power operation, where the photocurrent is proportional to the optical power.

Certain implementations may use state-of-the-art electronic-photonic integrated circuit (EPIC) technology to also enable integration of an on-chip automatic power control (APC) feedback circuit with the SLED. In this arrangement, a common die (including SLED with integrated photodetector) may further include electronic circuitry, which may be used to characterize the photocurrent generated by the integrated photodetector. In this way, a measure of the photocurrent can be identified and compared to a threshold level. In turn, a comparison output may be provided to control circuitry to control a bias current provided to the SLED, realizing APC and thus ensuring that the SLED emits a fixed optical output power that is defined by the user. Of course other implementations are possible. For example, an integrated SLED package may include multiple die, including a photonic die having the integrated SLED and integrated photodetector and a separate die, e.g., a complementary metal oxide semiconductor (CMOS)-based die having the electronic circuitry.

Figure 1:
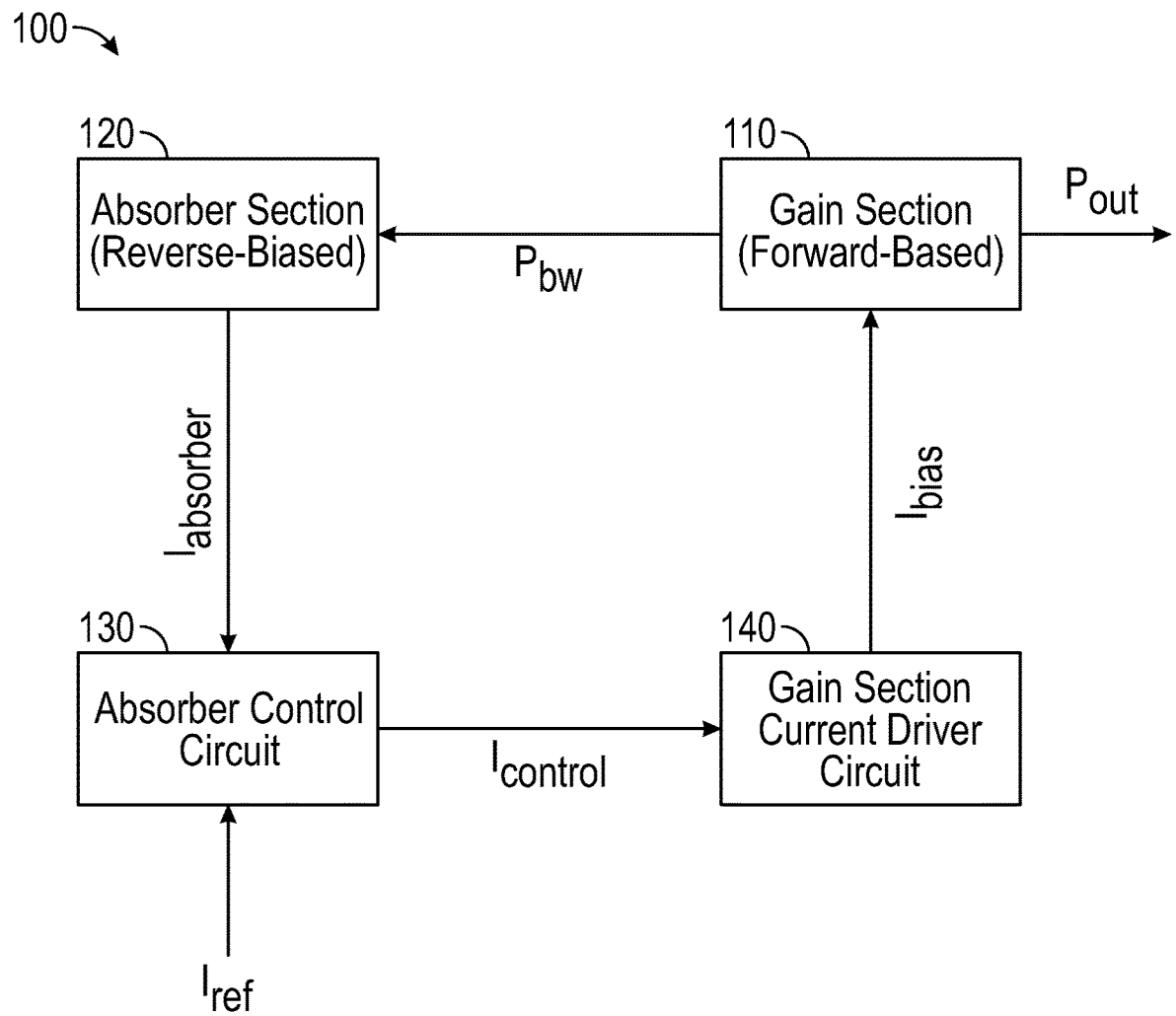
FIG. 1 is a schematic of an integrated SLED in accordance with an embodiment.

Referring now to FIG. 1, shown is a schematic of an integrated SLED in accordance with an embodiment. As shown in FIG. 1, SLED 100 includes a gain section 110. In embodiments, gain section 110 may be implemented as a forward-biased diode. Gain section 110 generates light that is output in a desired or forward direction with an optical power of $P_{out}$. This light source may be provided to a photonic IC (PIC) which may use the light source, e.g., in an integrated gyroscope or another application.

An absorber is provided on a backside (non-output side) of the SLED to extinguish backward propagating light. Without a rear absorber, optical feedback can cause the SLED to operate like a laser. By having high optical absorption on the backside, a light-emitting device may be controlled to operate as a SLED even at very high input currents, thus remaining in the regime of amplified spontaneous emission (ASE), rather than stimulated recombination like in a laser.

Thus as shown, gain section 110 further outputs light in the undesired or backwards propagating direction having an optical power of $P_{bw}$. This backwards propagating optical energy is absorbed in an absorber section 120. In embodiments herein, absorber section 120 is integrated with gain section 110 and may be implemented as a reverse-biased diode. Reverse-biasing the absorber diode enables high-power operation of the SLED because saturation of the absorption does not happen since photogenerated carriers are extracted by the built-in and externally applied electric fields. Reverse-biasing the absorber allows its use as an MPD and it extends the optical power range over which the absorber is sufficiently absorbing. Thus not only does absorber section 120 act as an absorber, it also is configured as a photodiode to generate a photocurrent, $I_{absorber}$, based on the backward propagating optical energy. Absorber section 120 as photodetector converts the photon stream into an electric current, from which the optical power may be directly determined.

Still with reference to FIG. 1, this feedback information, namely the absorber current, is provided to an absorber control circuit 130. In some implementations, absorber control circuit 130 may be implemented on a common semiconductor die or substrate with gain section 110 and absorber section 120. In other cases, absorber control circuit 130 may be implemented as a separate component. In any case, absorber control circuit 130 may be configured to perform a comparison between this feedback photocurrent $I_{absorber}$ and a reference current, $I_{ref}$. In various embodiments, this reference current may be based on a user input according to how much optical power the user wants for a given application. For example, a user-defined optical power level of 50 milliwatts (mW) may have a higher $I_{ref}$ than a 10 mW level. Based on the comparison, absorber control circuit 130 outputs a control signal (which may be in the form of a control current $I_{control}$) to a gain section current driver circuit 140. As with the discussion of absorber control circuit 130, driver circuit 140 may be implemented on a common die or substrate or as a separate component, depending upon desired implementation.

In embodiments, driver circuit 140 may generate a bias current $I_{bias}$, which it provides to gain section 110 based on the control current. In this way, optical power ($P_{out}$) output from gain section 110 may be controlled to be fixed to a user-defined output power, $P_{opt,out}$. In an implementation in which all components shown in FIG. 1 are adapted on a single die (or on a common substrate), a compact and highly integrated APC feedback circuit is realized.

Figure 2:
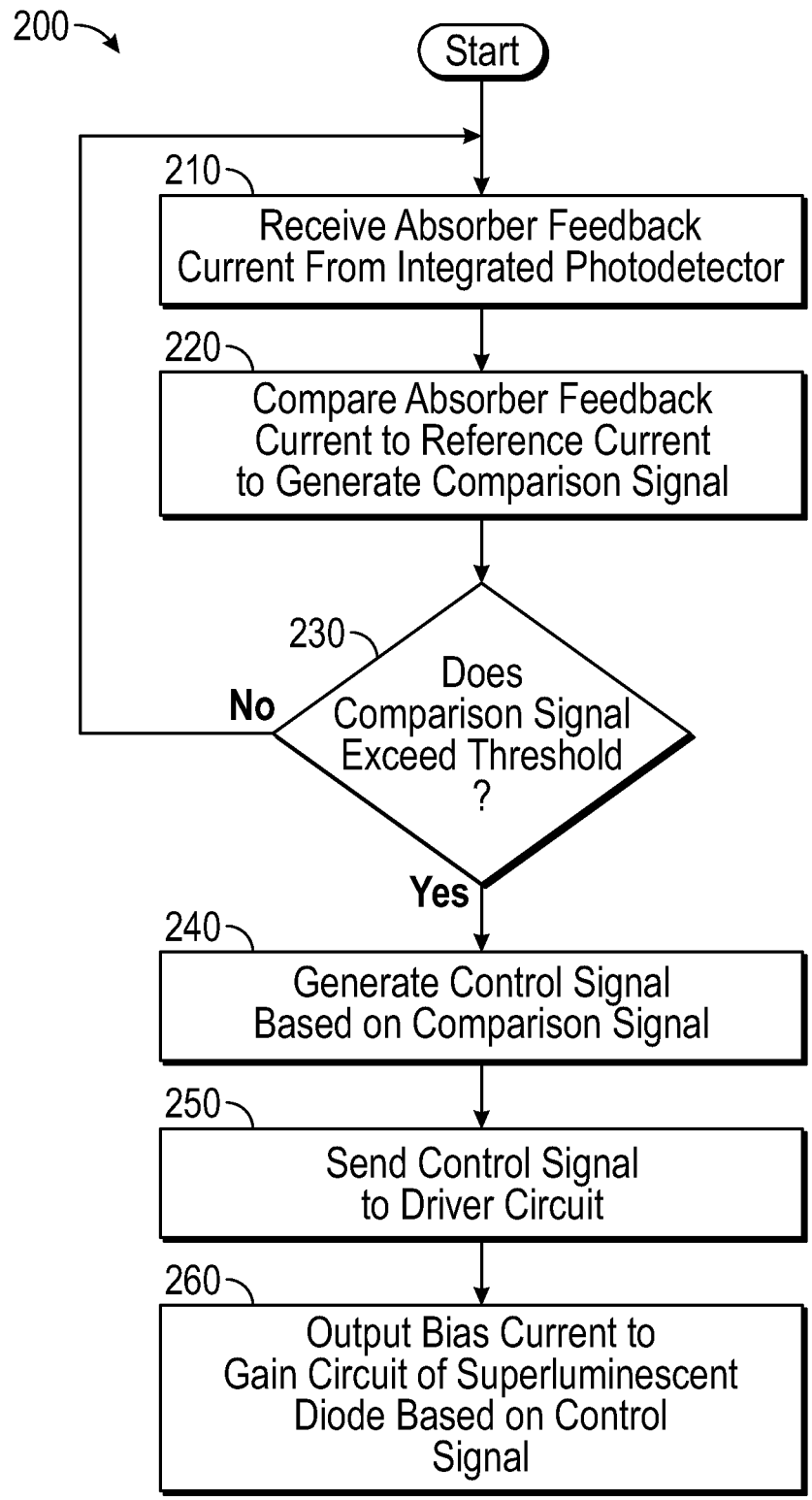
FIG. 2 is a flow diagram of a method in accordance with an embodiment.

Referring now to FIG. 2, shown is a flow diagram of a method in accordance with an embodiment. As shown in FIG. 2, method 200 is a method for performing automatic power control of a SLED using an integrated photodetector and integrated power control circuitry, such as shown in FIG. 1 above. As such, method 200 may be performed by hardware circuitry such as an integrated hardware control circuit, alone or in combination with firmware and/or software.

As illustrated, method 200 begins by receiving an absorber feedback current from an integrated photodetector (block 210). This absorber feedback current may be received in an APC circuit, which may include absorber control circuit 130 in FIG. 1. Then at block 220 this absorber feedback current is compared to a reference current to generate a comparison signal. This comparison signal may be obtained as an output of a comparator which receives, via a first input terminal, the absorber feedback current and receives, via a second input terminal, the reference current. In one implementation, this comparison signal may have a positive value when the absorber feedback current exceeds the reference current, and a negative value when the absorber feedback current is less than the reference current.

In some cases to provide a measure of hysteresis, no control update may occur when this comparison signal is below some threshold level. Thus it may be determined at diamond 230 whether the comparison signal exceeds this threshold level. In some cases, this threshold level may be set at a relatively small value to provide fine-grained control of optical power. In some cases, the threshold may be set at zero, such that any variation from the reference current level triggers a positive determination at diamond 230.

Still referring to FIG. 2, assuming that the comparison signal exceeds the threshold level, control passes to block 240 where a control signal may be generated based on this comparison signal. In some cases there may be a table that is indexed using the comparison signal to identify an appropriate control signal for output. In other cases, the comparison signal itself may be used as the control signal. The control signal is sent to a driver circuit (block 250), such as gain section current driver circuit 140 of FIG. 1. In such case, this control signal is the control current $I_{control}$.

Still with reference to FIG. 2, at block 260 the driver circuit may output a bias current to a gain circuit of the SLED based on the control signal. To this end, the driver circuit may include a current mirror to provide a bias current based on the control signal. Note that in various implementations, the bias current may be provided with positive and negative portions to be provided to appropriately forward-bias the SLED.

As one specific example, assume a user seeks a fixed output power of 50 mW. This desired output power may be converted into a reference MPD current ($I_{ref}$). If the detected MPD current ($I_{absorber}$) is less than $I_{ref}$, the absorber control circuit sends a control current ($I_{control}$) to the SLED current driver circuit. In response to $I_{control}$, the gain section's input current ($I_{bias}$) is increased, thus increasing the output optical power in the forward and backward directions ($P_{out}$ and $P_{bw}$), which increases the MPD current ($I_{absorber}$). This control process may continue until $I_{absorber}$ equals $I_{ref}$ at which point the SLED is emitting the desired optical output power of 50 mW. Understand that while shown at this high level in the embodiment of FIG. 2, many variations and alternatives are possible.

Figure 3A:
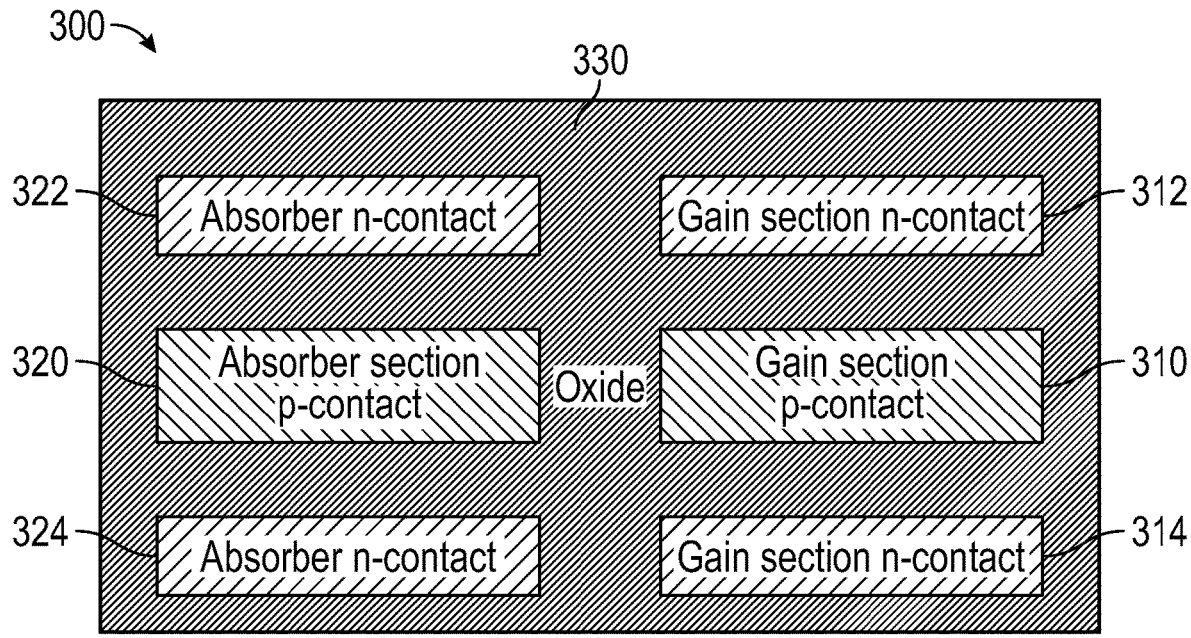
FIGS. 3A and 3B, are, respectively, a top view and a cross section view of an integrated SLED in accordance with an embodiment.
Figure 3B:
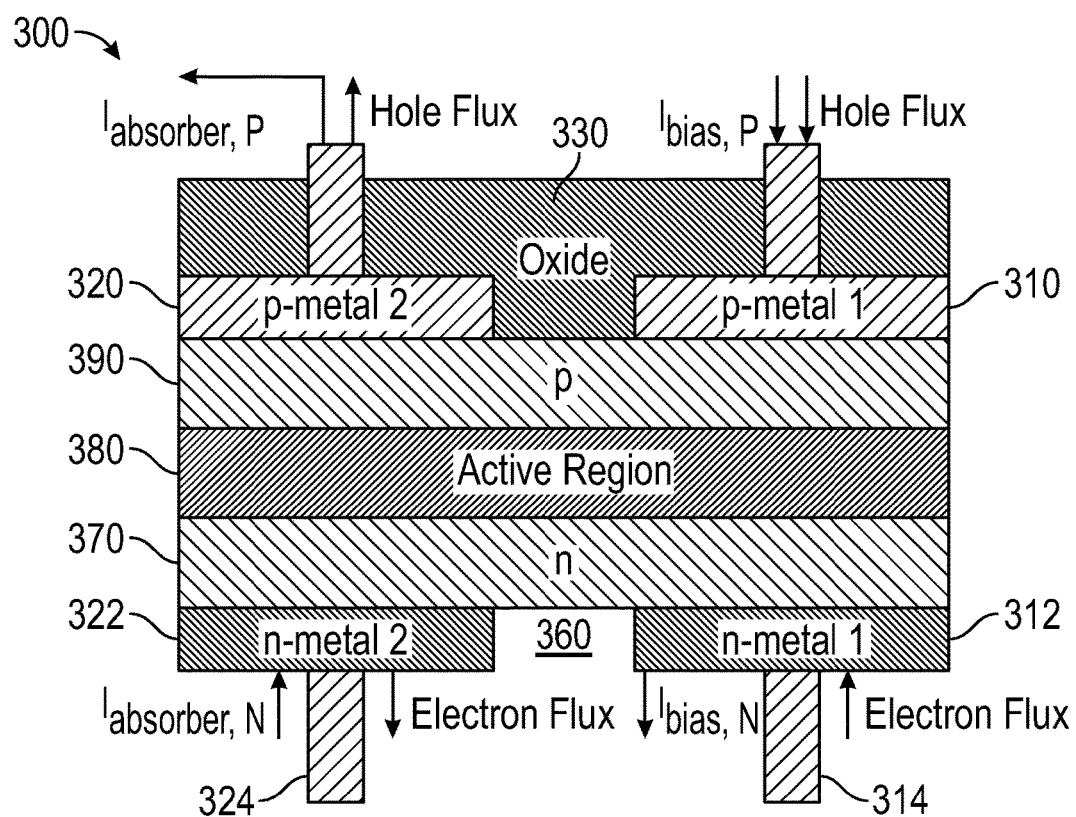

Referring now to FIGS. 3A and 3B, shown are, respectively, a top view and a cross section view of an integrated SLED having an integrated photodetector and integrated control circuitry in accordance with an embodiment. As illustrated in FIG. 3A, in a top view a semiconductor die has an integrated SLED that is associated with a first contact set and an integrated photodetector (absorber) that is associated with a second contact set. When viewed from this top down aspect, a contiguous III-V ridge with two distinct set of contacts is seen.

As shown, a first contact 310 is associated with a gain section and a second contact 320 is associated with an absorber section. Contacts 310,320 may be implemented with an appropriate conductive material, e.g., a p-metal. These contacts may be separated from each other via an insulative material, e.g., an oxide layer 330. Note that contacts 310, 320 and oxide layer 330 may be generally implemented as upper layers of a semiconductor stack. As further shown in FIG. 3A, additional contacts may be provided via one or more conductive layers, namely an n-metal layer that includes contacts 312,314 and 322, 324, associated with gain and absorber sections, respectively. Accordingly as shown in FIG. 3A appropriate contact locations are provided to enable integration of a SLED and a photodetector on a single semiconductor die.

Referring now to FIG. 3B, in this cross-sectional view, a semiconductor stack on which the gain section and absorber sections are formed includes a p-type layer 390, an active region 380 and an n-type layer 370. As further shown, to provide contacts for an absorber feedback current and a bias current, an additional p-metal layer may be formed on p-layer 390. This p-metal layer includes absorber section p-contact 320 and gain section p-contact 310.

Similarly, an additional n-metal layer includes absorber section n-contacts 322, 324 and gain section n-contacts 312, 314. Thus by way of contacts 320, 322, 324 the absorber feedback current is provided with corresponding hole and electron fluxes. Similarly, by way of contacts 310, 312, 314, the bias current is provided with corresponding hole and electron fluxes. As further shown, to provide isolation, oxide layer 330 separates contacts 310 and 320. Similarly, an isolation 360, which may be implemented as another oxide layer, may separate contacts 312, 322 (and 314, 324).

In this implementation, the gain section may be formed of a semiconductor active region (bulk material, or quantum wells, or quantum wires, or quantum dots) that is adapted between p and n-doped layers to form a p-i-n diode. Current is driven into the active region by forward biasing the diode, and light is generated by the process of spontaneous emission. An electrical isolation section electrically isolates the absorber's contacts from the gain section's contacts. Without the isolation section, there would be significant leakage current from the gain section to the absorber section, which would result in poor injection efficiency. In an embodiment, the isolation section may be implemented as a segment of III-V material with no metal contacts on top of it, and it may extend from a few tens of micrometers to a few hundred micrometers in length. In turn, the rear absorber section is made of the same material as the gain section, but its active region is unpumped, i.e., no current injection. This makes the absorber optically lossy, and the absorber p-i-n diode is reverse-biased in order to extract the photogenerated current. Although embodiments are not limited in this regard, representative materials for a PIC having integrated SLED and photodetector may be a given III-V material, such as Gallium Arsenide (GaAs), Aluminum Gallium Indium Phosphide (AlGaInP), Aluminum Gallium Arsenide (AlGaAs), or Aluminum Gallium Indium Nitride (AlGaInN).

Since the gain and absorber sections are biased differently, separate contact sets are provided, as illustrated in FIGS. 3A and 3B. If a two-metal process is available, then the two contact sets are isolated to avoid shorting. If only a single metal process is available, masks may be designed to avoid shorting the absorber and gain section contacts. The n-contact metal may be a lateral or a vertical contact, and the n-contact of the absorber is isolated from the gain section's n-contact, similar to the p-contacts.

Note that while shown with a limited number of layers and a limited cross-section of a semiconductor die, it is possible for electrical circuitry such as CMOS logic that may implement an absorber control circuit and a driver circuit to also be adapted on the semiconductor die, e.g., by wafer bonding. In other cases, separate dies may be provided for optical and electrical portions, where each of these separate die are adapted on a common substrate such as a silicon on insulator (SOI) substrate. In this way, an integrated SLED package may be provided with an integrated photodetector and integrated power control.

Figure 4:
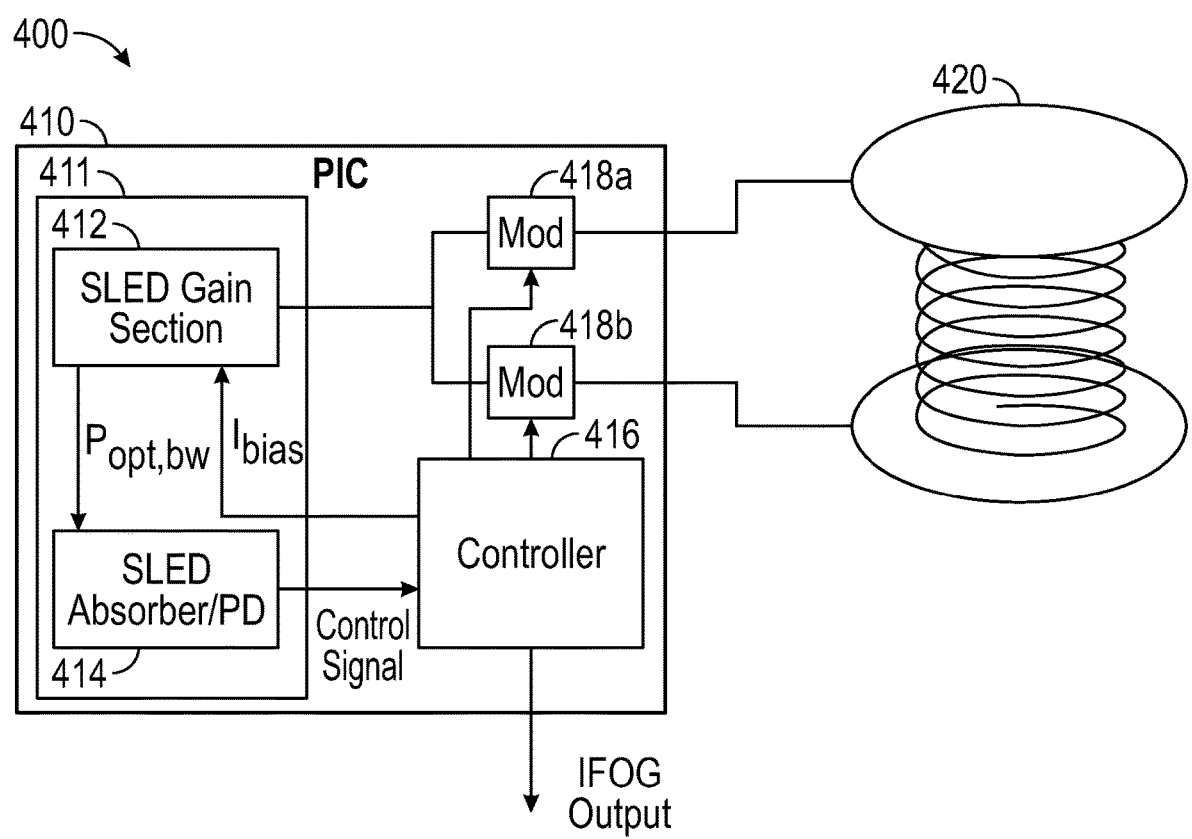
FIG. 4 is a block diagram of a system in accordance with an embodiment.

Referring now to FIG. 4, shown is a block diagram of a system in accordance with an embodiment. More specifically in FIG. 4, a fiber optic gyroscope 400 is illustrated at a high level. In this implementation, gyroscope 400 includes a PIC 410 which may be formed as described herein. As such, PIC 410 includes an integrated SLED 411 having a SLED gain section 412 and a SLED absorber/photodetector 414 to receive a power output from SLED gain section 412. PIC 410 further includes a controller 416 and modulators 418$_{a,b}$. In embodiments, controller 416 may include APC circuitry to control bias current to the SLED's gain section 412 based at least in part on a measured feedback current detected by absorber/photodetector 414 in response to backwards propagating light. Controller 416 may, in an embodiment, also include field programmable gate array circuitry and power management circuitry. As shown controller 416 provides a modulation signal to modulators 418$_{a,b}$.

As further illustrated, gyroscope 400 further includes a fiber optic coil 420, which receives optical energy from SLED 412. Controller 416 may further receive a measure of the optical energy in the different directions of optical fiber 420 in order to determine gyroscopic information, which may be sent as an integrated fiber optic gyroscope output. Understand while shown at this high level in the embodiment of FIG. 4, many variations and alternatives are possible. Still further, understand that a PIC having integrated photodetector and SLED may be used in other systems such as a multimode communication system or spectroscope.

The following examples pertain to further embodiments.

In one example, an apparatus for a SLED includes: a first diode adapted on a semiconductor die, the first diode to be forward-biased to output optical energy in response to an electrical bias signal; a second diode adapted on the semiconductor die, the second diode to be reverse-biased, the second diode to receive and absorb back propagating optical energy from the first diode and output a measure of the back propagating optical energy as an absorber feedback current; a comparator to compare the absorber feedback current to a reference current and output a comparison signal; and a driver control circuit coupled to the comparator. The driver control circuit may provide the electrical bias signal to the first diode based at least in part on the comparison signal.

In an example, the comparator and the driver control circuit are adapted on the semiconductor die.

In an example, the comparator is to receive the reference current comprising a user-provided value.

In an example, when the absorber feedback current is greater than the reference current, the gain control circuit is to reduce a level of the electrical bias signal.

In an example, the apparatus further comprises a photonic integrated circuit comprising the semiconductor die.

In an example, the apparatus further comprises a SOI substrate, where the semiconductor die is adapted on the SOI substrate and a second semiconductor die is adapted on the SOI substrate, the second semiconductor die comprising at least one of the comparator and the driver control circuit.

In an example, the second diode comprises an absorber which also functions as a monitor photodetector.

In an example, the apparatus further comprises a first contact set coupled between the first diode and the driver control circuit, the first contact set to provide the electrical bias signal to the first diode.

In an example, the apparatus further comprises a second contact set coupled between the second diode and the comparator, the second contact set to provide the absorber feedback current to the comparator.

In another example, a method comprises: receiving, in an integrated photodetector coupled to a gain section of a SLED, optical energy from the gain section; generating, in the integrated photodetector, a feedback current from the optical energy; and providing the feedback current to a power control circuit.

In an example, the method further comprises: comparing, in the power control circuit, the feedback current to a reference current and outputting a comparison signal based on the comparison; and providing a bias current to the gain section based at least in part on the comparison signal.

In an example, the method further comprises providing the bias current to the gain section via a first contact set, the first contact set including a first contact of a first metal layer and a plurality of contacts of one or more second metal layers, the SLED formed, at least in part, with a p-i-n stack adapted between the first metal layer and the one or more second metal layers.

In an example, the method further comprises providing the feedback current to the power control circuit via a second contact set, the second contact set including a second contact of a first metal layer and a plurality of contacts of one or more second metal layers, the integrated photodetector further comprising an absorber and formed, at least in part, with a p-i-n stack adapted between the first metal layer and the one or more second metal layers.

In another example, a system comprises a photonic integrated circuit and a fiber optic coil coupled to the photonic integrated circuit to receive and communicate optical energy. The photonic integrated circuit may include: a SLED that comprises a forward-biased gain section adapted on a first die, to output optical energy in response to a bias signal; and an absorber/photodetector adapted on the first die, the absorber/photodetector to receive back propagating optical energy from the forward-biased gain section and output a measure of the back propagating optical energy, where the bias signal is based on the measure of the back propagating optical energy.

In an example, the photonic integrated circuit further comprises an automatic power control circuit.

In an example, the automatic power control circuit comprises: a comparator to compare the measure of the back propagating optical energy to a reference value and output a comparison signal; and a control circuit coupled to the comparator, where the control circuit is to generate the bias signal based at least in part on the comparison signal.

In an example, the automatic power control circuit is adapted on the first die.

In an example, the SLED comprises a forward-biased gain section diode and a reverse-biased absorber/photodetector diode.

In an example, the first die comprises: a first contact set to provide the bias signal to the forward-biased gain section diode, the first contact set comprising: a first contact coupled to a p-type layer of the forward-biased gain section diode; a second contact coupled to an n-type layer of the forward-biased gain section diode; and a third contact coupled to the n-type layer of the forward-biased gain section diode; and a second contact set to output the measure of the back propagating optical energy, the second contact set comprising: a fourth contact coupled to a p-type layer of the reverse-biased absorber/photodetector diode; a fifth contact coupled to an n-type layer of the reverse-biased absorber/photodetector diode; and a sixth contact coupled to the n-type layer of the reverse-biased absorber/photodetector diode.

In an example, the system comprises a fiber optic gyroscope.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus for a superluminescent light emitting diode (SLED) comprising:
   a first diode adapted on a semiconductor die, the first diode to be forward-biased to output optical energy in response to an electrical bias signal;
   a second diode adapted on the semiconductor die, the second diode to be reverse-biased, the second diode to receive and absorb back propagating optical energy from the first diode and output a measure of the back propagating optical energy as an absorber feedback current;
   a comparator to compare the absorber feedback current to a reference current and output a comparison signal; and
   a driver control circuit coupled to the comparator, wherein the driver control circuit is to provide the electrical bias signal to the first diode based at least in part on the comparison signal.

2. The apparatus of claim 1, wherein the comparator and the driver control circuit are adapted on the semiconductor die.

3. The apparatus of claim 1, wherein the comparator is to receive the reference current comprising a user-provided value.

4. The apparatus of claim 1, wherein when the absorber feedback current is greater than the reference current, the driver control circuit is to reduce a level of the electrical bias signal.

5. The apparatus of claim 1, further comprising a photonic integrated circuit comprising the semiconductor die.

6. The apparatus of claim 1, further comprising a silicon on insulator (SOI) substrate, wherein the semiconductor die is adapted on the SOI substrate and a second semiconductor die is adapted on the SOI substrate, the second semiconductor die comprising at least one of the comparator and the driver control circuit.

7. The apparatus of claim 1, wherein the second diode comprises an absorber further comprising a monitor photodetector.

8. The apparatus of claim 7, further comprising a first contact set coupled between the first diode and the driver control circuit, the first contact set to provide the electrical bias signal to the first diode.

9. The apparatus of claim 8, further comprising a second contact set coupled between the second diode and the comparator, the second contact set to provide the absorber feedback current to the comparator.

* * * * *